United States Patent
O'Brien et al.

(10) Patent No.: US 7,822,084 B2
(45) Date of Patent: Oct. 26, 2010

(54) METHOD AND APPARATUS FOR STABILIZING AND TUNING THE BANDWIDTH OF LASER LIGHT

(75) Inventors: Kevin M. O'Brien, San Diego, CA (US); Robert N. Jacques, San Diego, CA (US)

(73) Assignee: Cymer, Inc., San Diego, CA (US)

(*) Notice: Subject to any disclaimer, the term of this patent is extended or adjusted under 35 U.S.C. 154(b) by 252 days.

(21) Appl. No.: 12/082,253

(22) Filed: Apr. 9, 2008

(65) Prior Publication Data
US 2008/0232408 A1 Sep. 25, 2008

Related U.S. Application Data (63) Continuation-in-part of application No. 11/510,037, filed on Aug. 25, 2006.

(60) Provisional application No. 60/774,770, filed on Feb. 17, 2006, provisional application No. 60/923,486, filed on Apr. 13, 2007.

(51) Int. Cl.
*H01S 3/137* (2006.01)
*H01S 3/082* (2006.01)
*H01S 3/097* (2006.01)
*H01S 3/131* (2006.01)

(52) U.S. Cl. ............ 372/32; 372/19; 372/29.011; 372/29.02; 372/55; 372/100; 372/102

(58) Field of Classification Search ............ 372/29.011, 372/32, 55, 19, 29.02, 100, 102
See application file for complete search history.

(56) References Cited

U.S. PATENT DOCUMENTS 4,823,354 A 4/1989 Znotins et al. ............ 372/57

(Continued)

FOREIGN PATENT DOCUMENTS

JP 2006-024855 1/2006

(Continued)

OTHER PUBLICATIONS

Dunstan et al., "Active Spectral Control of DUV light sources for OPE minimization," SPIE, vol. 6154-94 vol. 2, pp. 1-9 (2006).

(Continued)

*Primary Examiner*—Minsun Harvey
*Assistant Examiner*—Michael Carter
(74) *Attorney, Agent, or Firm*—DiBerardino Law LLC (57) ABSTRACT

According to aspects of an embodiment of the disclosed subject matter, method and apparatus are disclose that may comprise adjusting a differential timing between gas discharges in the seed laser and amplifier laser for bandwidth control, based on the error signal, or for control of another laser operating parameter other than bandwidth, without utilizing any beam magnification control, or adjusting a differential timing between gas discharges in the seed laser and amplifier laser for bandwidth control, based on the error signal, or for control of another laser operating parameter other than bandwidth, while utilizing beam magnification control for other than bandwidth control, and adjusting a differential timing between gas discharges in the seed laser and amplifier laser for bandwidth control, based on the error signal, or for control of another laser operating parameter other than bandwidth, while utilizing beam magnification control for bandwidth control based on the error signal.

32 Claims, 9 Drawing Sheets

U.S. PATENT DOCUMENTS

| | | | | |
|---|---|---|---|---|
| 4,881,231 | A | 11/1989 | Jain | 372/32 |
| 6,005,879 | A | 12/1999 | Sandstrom et al. | 372/25 |
| 6,393,037 | B1 | 5/2002 | Basting et al. | 372/20 |
| 6,490,308 | B2 | 12/2002 | Albrecht et al. | 372/59 |
| 6,690,704 | B2 | 2/2004 | Fallon et al. | 372/58 |
| 6,856,638 | B2 | 2/2005 | Aab et al. | 372/57 |
| 7,039,086 | B2 | 5/2006 | Fallon et al. | 372/55 |
| 2002/0048288 | A1 | 4/2002 | Kroyan et al. | 372/20 |
| 2002/0085606 | A1* | 7/2002 | Ness et al. | 372/55 |
| 2003/0118072 | A1 | 6/2003 | Wittak et al. | 372/58 |
| 2004/0057489 | A1 | 3/2004 | Aab et al. | 372/57 |
| 2005/0094698 | A1 | 5/2005 | Besaucele et al. | 372/57 |
| 2005/0185690 | A1 | 8/2005 | Rule et al. | 372/55 |
| 2006/0114956 | A1 | 6/2006 | Sandstrom et al. | 372/55 |
| 2006/0114958 | A1 | 6/2006 | Trintchouk et al. | 372/55 |
| 2006/0146900 | A1 | 7/2006 | Jacques et al. | 372/38.1 |
| 2006/0209917 | A1* | 9/2006 | Fallon et al. | 372/55 |
| 2007/0001127 | A1 | 1/2007 | Reiley et al. | 250/492.2 |
| 2007/0013913 | A1 | 1/2007 | Rafac | 356/451 |
| 2008/0253408 | A1 | 10/2008 | Ishihara | 372/20 |
| 2008/0253413 | A1 | 10/2008 | Partlo | 372/29.02 |
| 2008/0285602 | A1 | 11/2008 | Nagai et al. | |

FOREIGN PATENT DOCUMENTS

| | | | |
|---|---|---|---|
| JP | 2006024855 | * | 1/2006 |

OTHER PUBLICATIONS

Huggins et al., "Effects of laser bandwidth on OPE in a modern lithography tool," *Optical Microlithography XIX*, SPIE, vol. 6154, pp. 1-12 (2006).

Ishihara et al., "XLA-200: the Third Generation ArF MOPA Light Source for Immersion Lithography," *Optical Microlithography XVIII*, SPIE, vol. 5754, pp. 773-779 (2005).

Rafac et al., "Overcoming limitations of etalon spectrometers used for spectral metrology of DUV excimer light sources," *Optical Microlithography XVIII*, SPIE, vol. 5377, pp. 846-858 (2004).

Written Opinion of the International Searching Authority, Authorized officer Lee W. Young, mailed Aug. 1, 2008 in related application PCT/US08/04598, 5 pages.

* cited by examiner

FIG.7
Complete controller

METHOD AND APPARATUS FOR STABILIZING AND TUNING THE BANDWIDTH OF LASER LIGHT

CROSS-REFERENCE TO RELATED APPLICATIONS

The present application is a continuation-in-part of U.S. patent application Ser. No. 11/510,037, filed on Aug. 25, 2006, entitled ACTIVE SPECTRAL CONTROL OF DUV LIGHT SOURCE, published on Aug. 23, 2003, Pub. No. US-2007-0195836-A1, which claimed priority to a Provisional Application Ser. No. 60/774,770, filed on Feb. 17, 2006, entitled ACTIVE SPECTRAL CONTROL OF DUV LIGHT SOURCES FOR OPE MINIMIZATION, hereby incorporated herein by reference. The present application claims priority to Provisional Application Ser. No. 60/923,486, filed on Apr. 13, 2007, entitled TWO STAGE EXCIMER LASER WITH SYSTEM FOR BANDWIDTH CONTROL, hereby incorporated herein by reference. The present application is related to U.S. patent application Ser. No. 12/082,301, entitled LASER LITHOGRAPHY SYSTEM WITH IMPROVED BANDWIDTH CONTROL, filed contemporaneously with the present application and hereby incorporated herein by reference, and is related to U.S. patent application Ser. No. 12/082,254, entitled METHOD AND APPARATUS TO CONTROL OUTPUT SPECTRUM BANDWIDTH OF MOPA OR MOPO LASER, hereby incorporated herein by reference.

FIELD OF THE DISCLOSED SUBJECT MATTER

The disclosed subject matter related to active control of bandwidth, such as, in a DUV gas discharge laser system, such as, an excimer or molecular fluorine laser system used, such as, in a line narrowed application, such as, as a laser light source for integrated circuit manufacturing in photolithography.

BACKGROUND

Stabilizing bandwidth, such as, $E_{95}$ for DUV semiconductor integrated circuit photolithography laser light source design has included passive and active bandwidth controls. Active controls, can benefit such things as optical performance correction ("OPC") and tool-to-tool matching for such light sources. U.S. Provisional Patent Application Ser. No. 60/923,486, entitled TWO STAGE EXCIMER LASER WITH SYSTEM FOR BANDWIDTH CONTROL, filed on Apr. 13, 2006, includes the disclosure of U.S. patent application Ser. No. 11/510,037, entitled ACTIVE SPECTRAL CONTROL OF DUV LIGHT SOURCE, filed on Aug. 25, 2006, published on Aug. 23, 2007, Pub. No. US-2007-0195836-A1, which claims priority to U.S. Provisional Application Ser. No. 60/774,770, entitled ACTIVE SPECTRAL CONTROL OF DUV LIGHT SOURCES FOR OPE MINIMIZATION, filed on Feb. 17, 2006, the disclosures of each of which are hereby incorporated by reference. application Ser. No. 11/510,037, discloses a multistage bandwidth control system using coarse and fine control actuators.

That application discloses the utilization of grating bending (the position of a bandwidth control device "BCD" which bends the grating) as an actuator (control authority) along with other actuators. Various techniques are discussed enabling bandwidth stabilization. Active bandwidth control systems can use very accurate on-board spectrum measurement, such as $E_{95}$, and bandwidth error feedback. Compensation based on other laser parameter/output signals, such as target energy and duty cycle, can enable the control of various bandwidth selection actuators, including low frequency large amplitude actuators and a high frequency small amplitude actuators.

A photolithography light source laser, a Multiple-Input Multiple Output (MIMO) time varying, nonlinear system, could use an actuator(s) which itself could cause other effects to the laser performance than changing bandwidth, desirable or otherwise. Multi-stage, e.g., dual stage actuator designs, including affecting laser behavior with separate operating parameter inputs (actuators), working together, could be optimized to respond to a particular class(es) of disturbance(s). Disturbances can be categorized by the time scale and/or magnitude of impact. Pulse energy settings can include low magnitude fast time scale disturbances (typically msec to sec in a fine actuation range). High (timescales in seconds) and low (hours) frequency aspects of duty cycle set point and fluorine gas consumption (hours) changes can induce larger magnitude effects. Other longer-term parameter changes, component aging and misalignment (days to weeks or even longer) can result in the largest magnitude (in a coarse actuation range) changes.

Accordingly control action divided into coarse actuation and fine actuation was disclosed, with each utilizing one or more parameter change actuators. One could target large magnitude low frequency disturbances (large $E_{95}$ setpoint changes, gas aging effects and the long timescale component of duty cycle changes—resulting, e.g., from slow thermal loading variations, increasing age of laser components and the like). The other could target smaller magnitude higher frequency disturbances (output pulse energy, and the fast component of duty cycle changes—resulting, e.g., from faster thermal loading transients and the like). The coarse actuator can also serve to de-saturate, or re-center, a fine actuator(s) within its control range.

Coarse actuators, such as, ($F_2$ gas injection) and fine actuator ($\Delta t_{MOPA}$), grating bending or other wavefront conforming adjustments, or adjustable aperturing the beam, etc. were shown to regulate bandwidth, with various impacts on other laser parameters and with time frames of measurement for feedback and actuation allowing decoupling and use together for bandwidth control. The term dtMOPA or $\Delta t_{MOPA}$ or differential firing timing, or differential discharge timing, or differential commutation control, as used herein, are all shorthand notations for the concept of timing the discharge between the seed laser electrodes and the amplifier laser electrodes so as to selectively amplify a portion of the seed laser pulse in the amplifier gain medium to select bandwidth of the output of the laser light source. Sufficient ranges of actuation were noted to be able to account for bandwidth deviation from such affects that commonly need to be suppressed as from long term duty cycle variations, gas aging and component aging. The controllers could be compensated for/desensitized to error signal variations due to other laser operating parameters (filtering and other normalization).

Variable magnification of a beam incident on a center wavelength selection optical element, such as a dispersive grating, can also affect bandwidth of the light source. Such a system is discussed in U.S. Pat. No. 6,393,037 which issued to Basting et al. on May 21, 2002, the contents of which are hereby incorporated by reference herein. The abstract of Basting describes a tunable laser including an angular dispersive optical element (grating) and a beam expander including one or two rotatable prisms in a line narrowing module to adjust the bandwidth. The prism beam expanders, when two are used, are disclosed to be mechanically linked to each other so that the angle of incidence of the beam on the dispersive element is not changed when the magnification changes. This arrangement makes it very difficult, if not impossible, to control center wavelength as well as bandwidth utilizing the rotatable prisms. In addition the bandwidth control system using the two prisms operating in tandem is quite difficult.

GigaPhoton is believed to advertise a product that performs E95 control using some sort of optical actuation. Japanese Published Patent Application 2006024855, published on Jul. 9, 2004, discloses a variable magnification LNM also, with two rotatable prisms and the use of a differential discharge firing timing between a seed laser and amplifier laser for bandwidth control. Such an arrangement makes it difficult, if not impossible, to control center wavelength and bandwidth using the prisms, and controlling bandwidth with dtMOPA in such a system may have certain shortcomings.

The existing types of active bandwidth control can suffer from a number of shortcomings, such as taking too long to recover from a large disturbance such as a transient after a fluorine injection, or from a change in target bandwidth. These could cause the bandwidth to go off target by as much as $\geq 5$ fm, considering as an example a 55 shot moving average or $\geq 6$ fm, considering as an example a 55 shot moving standard deviation, added in quadrature. A return to the target could take more than ten seconds.

In addition, especially at low duty cycles, a target change, such as from 300 fm to 400 can be too slow, i.e., taking as long as about twenty seconds or from 400 fm down to 290 fm taking as long as about thirty seconds, when the requirement may be as low as around 10 seconds.

Among other things, errors can result from a filtering of control signals, such as a holdoff of too many pulses before a controller step signal can be issued to a bandwidth actuator stepper, such that at low duty cycles where bandwidth may be sampled less frequently, there is a much higher chance that step commands will not occur during a burst. Since the stepper commands or the stepper itself may be disabled during an inter-burst interval, burst to burst errors in bandwidth can thus build upon each other, with no correction signals issued to the bandwidth control actuator(s).

Prior art bandwidth stability controls enabled the setting of a bandwidth control set point in a set and forget manner. More stringent requirements call for a tunable bandwidth setting controllable by the end user of the laser light source. It is also required that the bandwidth control system not negatively impact the control of other laser operating or output parameters, such as output pulse energy and dose stability and the like.

DETAILED DESCRIPTION OF THE DISCLOSED SUBJECT MATTER

The active bandwidth control according to aspects of an embodiment of the disclosed subject matter has as its aim to control the E95 bandwidth of laser light, utilizing the same or similar input signal(s) as previously used active bandwidth control systems, however, with signal processing and actuation mechanism(s) which are different. Accordingly a tunable advanced bandwidth stabilization "ABS" ("T-ABS") is proposed to control bandwidth to some target set point, which may be selected by a laser end-user or by a laser light utilization tool control system.

Control of bandwidth to ±50 fm or less (for constant pulse repetition rates or other selected constant operating parameter) is proposed and with an error in bandwidth of greater than 50 fm, the system is able to return to the set point at greater than or equal to 0.0003 fm/laser shot. Center wavelength is not impacted or minimally impacted while control of bandwidth is in other than a target change mode (by <5 fm—considering by way of example a 55 shot moving average wavelength value—and <6 fm—considering a 55 shot moving standard deviation, which may be added in quadrature). A control algorithm may utilize various bandwith actuator control steppers for bandwidth selection (coarse and or fine), including a variable magnification line narrowing module ("VMLNM"), a bandwidth control module ("BWCM"), a beam analysis module ("BAM"), as discussed herein.

Figure 1:
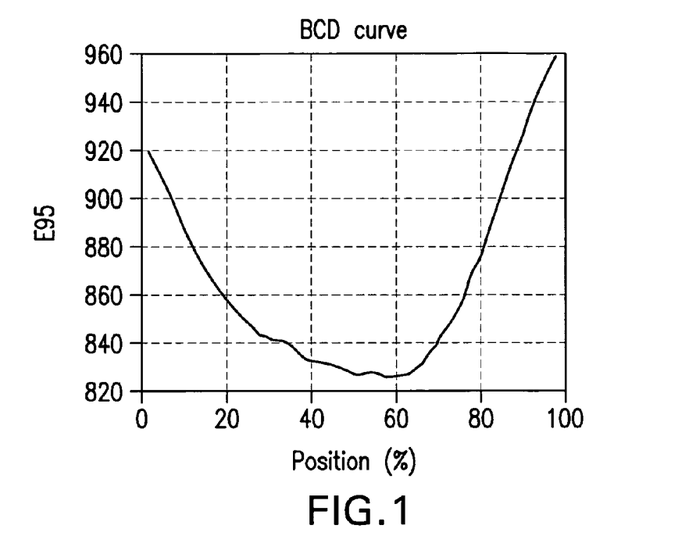
FIG. 1 shows a bandwidth control device $E_{95}$ sensitivity curve.

A measured E95 signal is used to determine an adjustment to a bandwidth control device ("BCD") or the like. BCDs that include a mechanism for deforming the center wavelength selection grating and thus impacting the bandwidth of the output of the laser light source, are well known in the art. Bandwidth control can be accomplished with the aim of staying on a particular side of a BCD operating curve, such as, the right hand side or left hand side of the BCD curve, as illustrated in FIG. 1.

Figure 2:
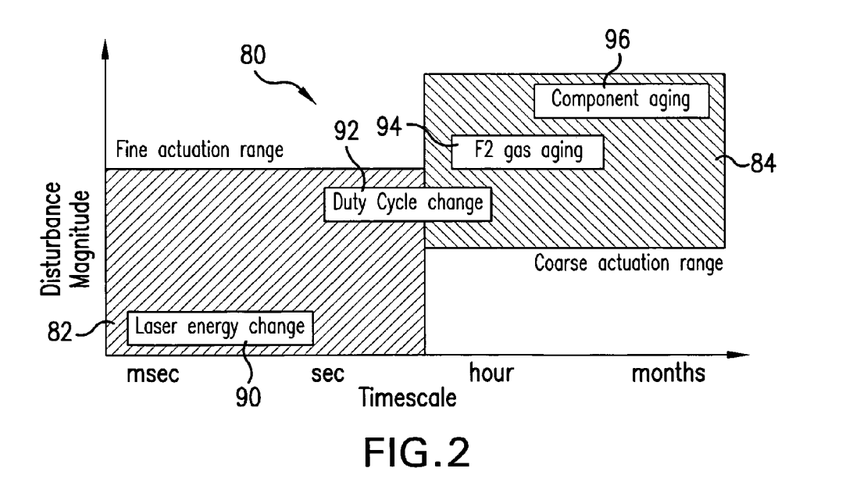
FIG. 2 illustrates disturbance types and time scales and magnitudes, according to aspects of an embodiment of the disclosed subject matter.

Applicants have noted that disturbances 80 may be categorized by the time scale and/or magnitude by which they affect such laser operating parameters as $E_{95}$ bandwidth, as illustrated in the chart of FIG. 2, as explained in more detail in U.S. patent application Ser. No. 11/510,037, entitled ACTIVE SPECTRAL CONTROL OF DUV LIGHT SOURCE, filed on Aug. 25, 2006, published on Aug. 23, 2007, Pub. No. US-2007-0195836-A1, incorporated by reference herein. As explained therein such disturbances 80 in a fine actuation range 82, such as energy change or higher frequency duty cycle effects, or coarse actuation range 84, such as lower frequency duty cycle effects, gas aging or component aging/misalignments, may be accounted for by bandwidth control actuators either coarse or fine or both together.

Figure 3:
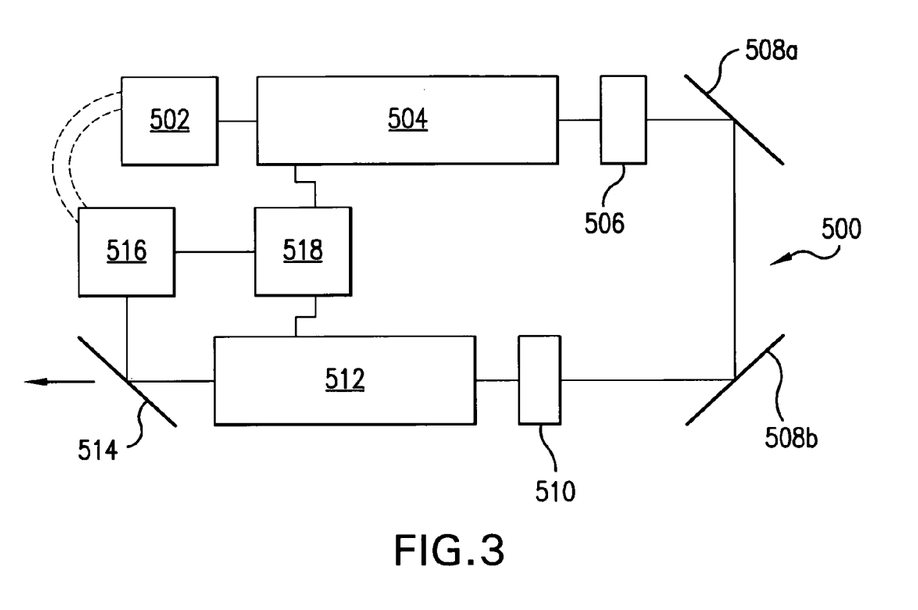
FIG. 3 shows schematically and in block diagram form a multi-stage gas discharge laser system having a variable magnification line narrowing module and differential firing time (dtMOPA) bandwidth control according to aspects of an embodiment of the disclosed subject matter.

FIG. 3 shows a multi-stage gas discharge laser 500 having both a variable magnification line narrowing module and differential firing time (dtMOPA) bandwidth control. The first stage may be either a master oscillator, MO, and a subsequent stage may be a one-pass power amplifier, a multi-pass power amplifier, a power oscillator or a traveling wave amplifier such as a power ring amplifier, in which oscillation occurs in a resonance cavity acting as an amplification stage.

An example of such a laser system can include some or all of the components shown in FIG. 3, depending on the configuration. The components shown in FIG. 3 include a variable magnification line-narrowing module 502, a first stage chamber 504, a first stage output coupler 506, turning optics 508a,b, an input coupler 510, a second stage chamber 512, a beam splitter 514, a bandwidth measurement module 516 and a discharge timing control module 518. The seed laser 504 may be a gas discharge excimer or molecular fluorine laser, such as an XCl, XF, KrF, ArF, $F_2$ or the like laser. These types of lasers are known for use in photolithography processing of wafers to make semiconductor circuits. The seed laser 504 may define an optical cavity, such as between the line narrowing module 502 and the output coupler 506 and produce an output. The amplifier laser 512 may receive the seed laser output through relay optics (mirrors 508a and b) and amplifying the seed laser output to produce a laser system output. The bandwidth metrology module 516, as is well known in the art, can measure the bandwidth of a laser output, and provide a bandwidth measurement which can be used by a bandwidth controller 516, which as discussed below, can be separate units, to generate a bandwidth error compared to a target/setpoint. Differential timing may be adjusted in response to the error signal to adjust laser system output bandwidth.

Figure 4:
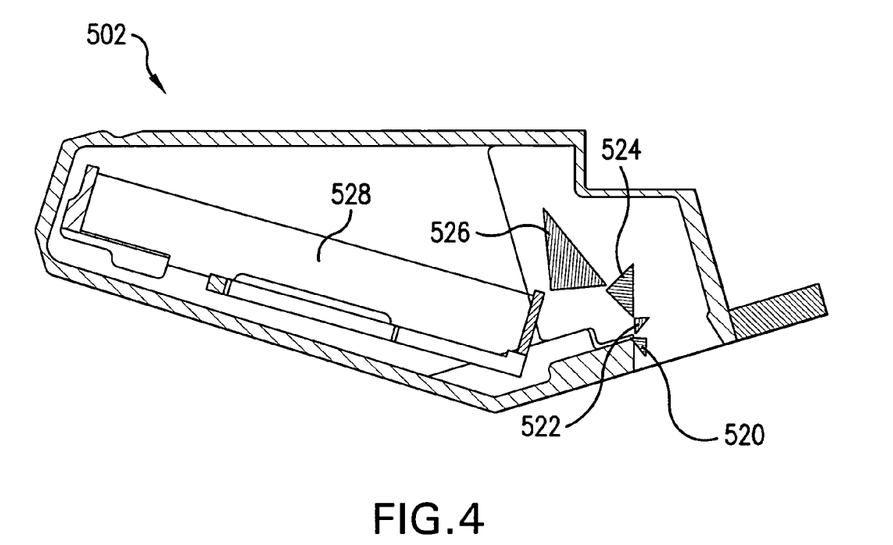
FIG. 4 shows schematically and in block diagram form an embodiment having four prisms and a grating, wherein at least one prism can be rotated to increase/decrease beam width and thereby alter bandwidth, according to aspects of one embodiment of the disclosed subject matter.

FIG. 4 shows a possible embodiment of a bandwidth (and center wavelength) actuator mechanism (control authority) having four prisms 520, 522, 524, 526 and a grating 528. Prism 520 may be mounted on an actuator (not shown) including a rotational motion mounting, e.g., a flexured mounting (not shown) so that the prism 520 may be rotatable via a rotational actuator, such as a stepper motor (not shown) and/or PZT (not shown) to increase/decrease beam width and thereby alter bandwidth. Prism 522 may be left stationary or may also have a rotational position actuator (not shown). Prism 524 may also be mounted for rotational movement, as described for prism 520, for example, to finely adjust center wavelength (e.g., on the order of femtometer changes). Prism 524 may also be so mounted to coarsely adjust center wavelength (e.g., on the order of tens of femtometers).

Figure 11:
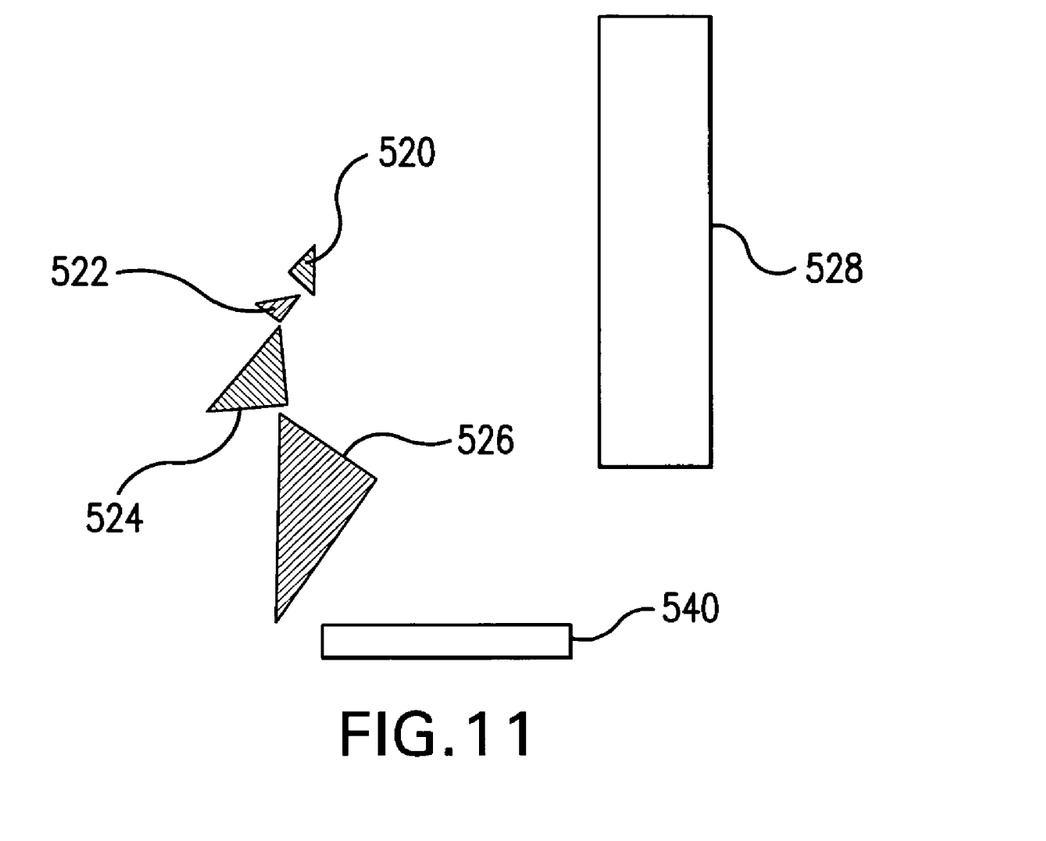

FIG. 11 illustrates schematically a possible embodiment of a bandwidth (and center wavelength) actuator mechanism (control authority) wherein such an $R_{MAX}$ mirror 540 and its actuator 540a, as is well known in the art for the laser system center wavelength selection, may be utilized to fold the expanded beam coming out of the beam expansion prism 526 onto a grating 528. The grating 528 may be an elongated grating in order to utilize the expanded beam, such as a 45× expanded beam. The mirror 540 may be used in part for center wavelength control by determining an angle of incidence of the beam on the grating 528. The $R_{MAX}$ folding mirrors known in the art themselves can have coarse and fine center wavelength control on a single optical element, i.e., utilizing a stepper motor (not shown) for coarse control and a PZT stack (not shown) for fine and fast center wavelength control, as noted above. In combination with a center wavelength control prism, such as prism 520, the $R_{MAX}$ mirror 540 may retain such control of its angle in relation to the grating 528 or utilize only the fine control of the PZT stack and not employ any stepper motor control. The center wavelength control prism, such as prism 520, may be used for coarse control and the $R_{MAX}$ folding mirror 540 may then be used for finer center wavelength control, or vice-versa.

In the latter embodiment, the PZT stack may be eliminated and only a stepper motor used to position the $R_{MAX}$ folding mirror for coarse center wavelength control, while the center wavelength control prism can be used for finer center wavelength selection. Alternatively, each of the prism mounts in the chain of prisms in the beam expansion mechanism may have an $R_{MAX}$-like coarse and fine control with a stepper motor for coarse adjustment and a PZT stack for fine adjustment, or the coarse adjusting prism may be controlled with a stepper motor, or the like mechanical adjustment, and the fine adjustment prism(s) by a faster and finer control actuator, such as a PZT stack.

Figure 7:
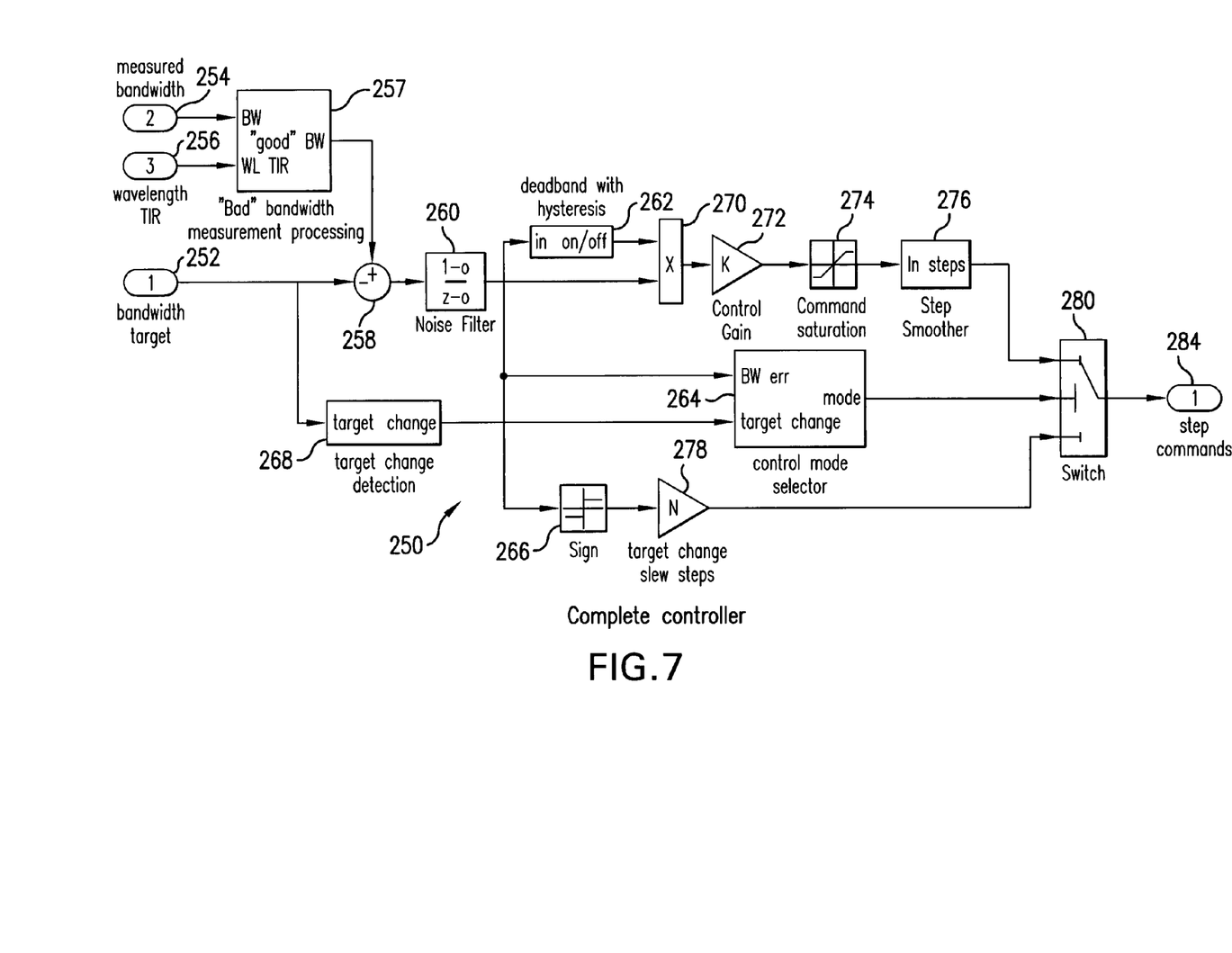
FIG. 7 illustrates schematically and in block diagram form a bandwidth controller according to aspects of an embodiment of the disclosed subject matter.

Signals may be accepted from laser hardware to indicate the measurement of E95 bandwidth from recent laser light. A controller, such as shown in FIG. 7, or portions of element 502 and/or 518 can then process these signals through various filtering, deadbands, hysteresis and smoothing, and can produce an output(s) in the form of a command(s) to an actuator(s) that can perform such functions as, by way of example, moving or distorting a mechanical and/or optical component(s). The movement or distortion of such component(s) can cause a change in E95 bandwidth, to reduce bandwidth error.

According to another possible embodiment, illustrated schematically in FIG. 12, an LNM with four prisms 520, 522, 524 and 526 to control bandwidth and wavelength is shown. Two of the prisms 524 and 526 can be rotated by actuators (not shown) similarly to the actuators for the prisms 524, 526 show in FIGS. 4 and 5. One 526 may be rotated by a stepper motor actuator (not shown) and the other 524 may be rotated by a PZT stack (not shown). These two prisms 526 and 524 respectively may be used for coarse and fine adjustment of wavelength. Their positioning may be in response to signals from a center wavelength controller system responding to center wavelength being not on target due to target change or center wavelength drift. At least one of the other prisms may be rotatable for bandwidth control, such as, prism 520. Rotation may be achieved using a stepper motor (not shown).

There may be several control modes, for example, but not limited to, where there is no magnification control exercised, i.e., the variable magnification LNM variation system is not employed, so that there is no impact on bandwidth control due to variable magnification. "In this mode, there may be two sub-modes, one where dtMOPA laser timing is not used to directly control bandwidth, and one where dtMOPA is used to directly control bandwidth.

In a second magnification driver mode variable magnification is also not employed, though the system drives the variable magnification to some selected value, for example to a maximum, such as to 45×. In this second variable magnification mode for a first dtMOPA timing mode the energy and timing control algorithm sets dtMOPA and neither dtMOPA nor variable magnification (apart from being driven to a selected value such as the full 45× magnification) is varied for bandwidth control. For a second dtMOPA timing control mode bandwidth is set using dtMOPA while the magnification is held at e.g. 45× magnification.

Another magnification control mode may be employed where magnification controls bandwidth based on some bandwidth feedback. Magnification can then be selected, as noted above, based on a target for bandwidth. In this mode of magnification control for a first dtMOPA control mode the energy and timing control algorithm sets dtMOPA timing for reasons other than bandwidth control, such as, laser efficiency, dose stability or the like. Magnification is selected to achieve a selected bandwidth independent of dtMOPA. In a second dtMOPA control mode the magnification of the VMLNM and dtMOPA may both be selected to achieve a target bandwidth, with one used as a coarse bandwidth selection mechanism and the other as a fine selection mechanism.

The system may be set such that a deadband with hysteresis arrangement is utilized, whereby, by way of example, control only turns on when error (absolute value) leaves a larger/outer deadband, and turns off when error returns to within a smaller/inner deadband. Also bandwidth motor dithering may be employed such as with a lower limit of the number of microsteps in one direction before changing directions. In addition with a bandwidth target change, the system may be configured to achieve the new target within some time limit for a given duty cycle such as 10 seconds at 5% DC, for, by way of example, a 100 pulse burst length, while use of the light source for photolithography is disabled. This may limit jitter and/or customize the bandwidth control to specific customer requirements.

When the filtered bandwidth is outside the deadband, the controller may command the stepper in only one direction, preventing jitter associated with operation near the deadband boundaries. This control enables bandwidth control actuator feedback position/initiation command issuance if the bandwidth (error signal) is greater than the high/outer deadband value, and disables command issuance if the bandwidth (error signal) is less than the low/inner deadband value. Otherwise the system does not change the current command issuance state (enabled or disabled) while the bandwidth (error signal) is intermediate the high/outer and low/inner deadband values. In other words, when the bandwidth (error) signal is intermediate the deadband limits, having entered this region from a high value, such that upon entry the command issuance was enabled, then it stays enabled until the bandwidth (error signal) crosses the low/inner deadband value and command issuance becomes disabled. Similarly, coming from less than the low/inner deadband value where command issuance is disabled, this function remains disabled until the bandwidth (error signal) crosses the high/outer deadband value.

The size of the deadband can be selected to trade off several performance values, such as reducing jitter, total speed of the controller response time to disturbances, and the magnitude of the allowed bandwidth error.

The system may utilize a function generator, which may employ a rich feature set in order to, by way of example only, command a bandwidth control actuator, such as a stepper motor, to arbitrary functions of shot count.

Separate hardware and software "gains" may be used in the software (in order to facilitate hardware upgradeability).

A controller holdoff may also be utilized such that, by way of example, no bandwidth steps within a certain number of pulses are allowed at the start of a burst, such as within 30 shots after start of a burst.

The three basic operations of the bandwidth control system may be performed using a bandwidth actuator such as a variable magnification LNM. Shot processing may occur on every shot (a shot being indicated by LAM updates). Bandwidth target change processing may occur when the bandwidth target changes.

Whenever the linecenter (wavelength) analysis module ("LAM") returns wavelength data, such as on a shot-by-shot basis, shot processing logic may be performed. Input signals may be passed in using a shot data record. The algorithm may perform its computations and populate the results into the same shot data record. A bandwidth analysis module ("BAM") status signal may be utilized to determine if new bandwidth data, such as E95 bandwidth data, is available. The system can then attempt to filter out bad or otherwise invalid bandwidth data.

The bandwidth control system such as one employing a bandwidth control actuator, such as a variable magnification line narrowing module ("VMLNM"), may be required to (1) achieve bandwidth stability to within some selected bandwidth, such as, about ±50 fm; (2) correct an error in bandwidth from a selected target or setpoint at a selected rate, such as, about 0.0003 fm/shot; (3) ensure wavelength stability is maintained, such as, when using bandwidth control with the bandwidth actuator allowing no more than a selected value, such as about 5 fm additional 55-shot moving average wavelength error, and no more than a selected value, such as, about 6 fm additional 55-shot moving standard deviation in wavelength error; (4) include a deadband with hysteresis, that can be used to change performance; (5) prevent stepper motor dither so that the stepper must take at least a selected number, such as, about 16 steps in one direction before steps in another direction are taken; and (6) provide for bandwidth target changes, that can be achieved within a selected time, such as, about 10 seconds, given, by way of example, a minimum shot rate of 200 pulses/second (for a 4 kHz pulse repetition rate laser system).

Accordingly, a filter may be utilized only on bandwidth updates. In between bandwidth updates, other functions may occur (e.g. step smoothing), but most other functions depend on the filtered error. So, when and if this is not changing, other controller states will also remain constant. The system may also use a bandwidth control algorithm determined using MOPA timing mode and BW stepper mode and also utilize a BW stepper motor function generator/playback, and provide "reset" of BW stepper to baseline magnification.

Bandwidth target may be required to change within some selected time, such as, about 10 seconds. Wavelength stability may not be required to be in spec during bandwidth target changes. A target change implies that the stepper may need to move at its fastest rate. The algorithm may command the stepper to move in the correct direction at the fastest rate possible, and then stop the stepper when the measured bandwidth is near the target. Alternatively, the algorithm may use knowledge of the bandwidth-versus-steps curve and position sensing of absolute steps to dead reckon the correct number of steps to take to achieve the target bandwidth.

If the number of shots fired in the current burst is less than or equal to a stored value indicating the number of shots to prevent bandwidth stepping at the beginning of a burst, and if the state of the target change mode is enabled ("1"), then the system may set the number of steps to take for this shot based on feedback control to =0. The total number of bandwidth steps to take on this shot may be computed to be the number of microsteps to command a bandwidth control mechanism actuation stepper, such as a variable magnification prism rotational stepper to equal the number of steps commanded based on feedback control.

The algorithm output may be updated, such as, if the absolute value of the number of microsteps to command the control actuator, such as the variable magnification stepper, is greater than zero or if the current target change state is not the same as the prior target change state, then the algorithm output may be set to 1 and otherwise set to 0. The algorithm output may be a signal indicating whether new stepper commands need to be sent to the controller for actuating bandwidth change to reduce the error signal, such as, to enable or not enable a BWCM, discussed in more detail below, to generate a signal to update a bandwidth control mechanism actuation stepper. The stepper may be for a variable magnification LNM rotating prism.

When a target change is detected, the algorithm can determine a new tracking error based on the current filtered error, previous bandwidth target, and new bandwidth target, i.e., the filtered error plus the previous target minus the new target. This can provide the correct direction for the stepper to move in. The algorithm may also then reset the filter such that the filtered error equals the new tracking error. The system may command the stepper to move at the maximum rate (called "slewing") in the required direction until the filtered bandwidth error is within some selected range of the target enabling cessation of slewing without overshoot. The algorithm can also check if the filtered error changes sign during the slew. Once either of these conditions is satisfied, the controller can revert to normal control.

Bandwidth "spikes" may occur due to large wavelength changes. During a bandwidth target change slew, the wavelength can also be impacted, due to coupling of the bandwidth stepping to wavelength. While the wavelength controller can compensate for these changes, it cannot do so during interburst intervals, such that if the stepper continues to slew, wavelength can change. After the interburst interval, the wavelength controller can have to react to a new and relatively large wavelength error. This can result in a rapid and large change to wavelength, even with the ability essentially to change by 2 pm, a very fast (and fine) wavelength control mechanism such as a PZT stack on an $R_{MAX}$, or prism positioning element changing the angle of incidence of the beam on the grating, acting as a primary wavelength control source.

Changes in wavelength during a BAM integration period may be perceived by the BAM as an increase in bandwidth. Generally, the faster the wavelength changes, the larger the positive bias in BAM measurements. If the wavelength change is fast enough, in some cases, a wildly large "spike" can be reported by the BAM. During a target change, such spikes can cause the controller to misinterpret the spike to mean that the bandwidth slew is completed, and revert back to normal control long before the target has been reached. This can cause the target change to take much longer than the selected time, such as, more than 10 seconds.

The controller may implement several methods to filter these bandwidth spikes. The spike may be caused by a large wavelength change over a short time. Ignoring bandwidth measurements when the wavelength has changed by more than a certain amount during a BAM integration window acts as a filter ignoring a bandwidth measurement when the Total Included Range (TIR) of wavelength is greater than some pre-determined value. The physical limit on the actual bandwidth (plus noise) enables filtering ignoring any bandwidth readings larger than some pre-determined value (e.g. 2× the maximum bandwidth). When a bandwidth reading is filtered/ignored, the last good (i.e. not ignored) measurement can be used in its place. Typical values might be Max allowed wavelength TIR=300 fm and Max allowed reported bandwidth=1000 fm.

The first few shots of a burst may often be characterized by large and sometimes repeatable transients, in both wavelength and energy. The wavelength control algorithm can contain logic that can prevent over-reaction to these burst transients. Wavelength is, however, more sensitive to disturbances during this initial period. Bandwidth steps (which may cause wavelength to change) can be prevented for the first selected number of shots of a burst, referred to in the present application as a burst holdoff. The number of shots to hold off is a controller operating parameter, and may be around 3 shots.

Figure 5:
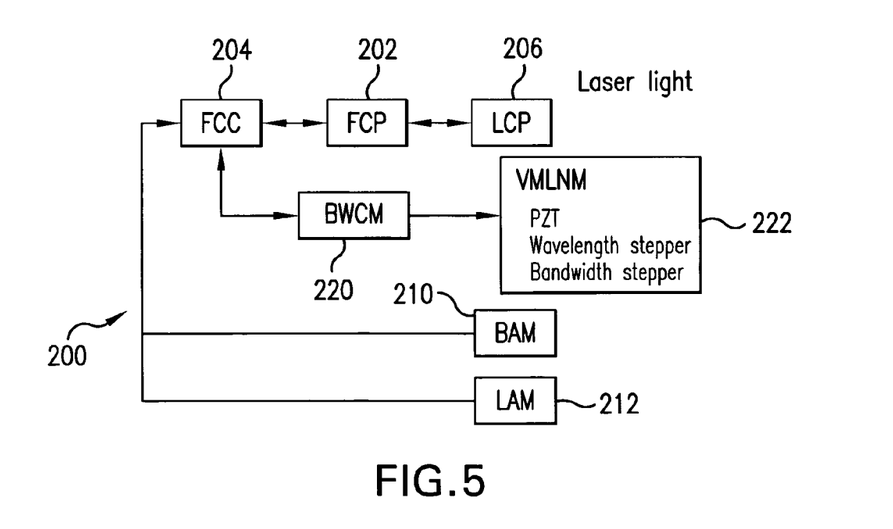
FIG. 5 illustrates a laser control system overall architecture useful with aspects of an embodiment of the disclosed subject matter.

FIG. 5 illustrates in block diagram form an overall architecture for a laser system controller 200 including bandwidth and wavelength control, generally the same as the controller discussed in U.S. Pat. No. 6,690,704, incorporated herein by reference, with the addition of a bandwidth control module ("BWCM") 220 and a variable magnification line narrowing module ("VMLNM") 222. A firing control platform ("FCP") processor 202 may control the firing of the discharges between the electrodes, such as in a single chamber laser system, like Cymer's 7000 series laser systems or between the electrodes in each of a plurality of laser chambers in a seed laser amplifier arrangement such as Cymer's XLA series of MOPA laser systems or XLR series of ring power amplifier MOPO laser systems. The FCP 202 may utilize control algorithm software, and provide control signals to a firing control communicator ("FCC") 204.

The FCP 202 may respond to command signals from a laser control processor ("LCP") 206 and communicate with the LCP 206. The FCC 204 may receive wavelength and bandwidth information from a beam analysis module ("BAM") 210, somewhat similar to the spectral analysis module ("SAM") discussed in the '704 patent, for bandwidth, and a line center analysis module ("LAM") 212, for center wavelength, and may interrupt the FCP 202 to run a wavelength or bandwidth control algorithm or both. The FCC 204 may also pass FCP 202 commands to a bandwidth control module ("BWCM") 220, which can be utilized to command all actuators used to control bandwidth or wavelength, such as may be present in a variable magnification line narrowing module ("VMLNM") 222. The status of VMLNM 222 and its actuators may be communicated back to the FCP 202 via the FCC 204.

Figure 6:
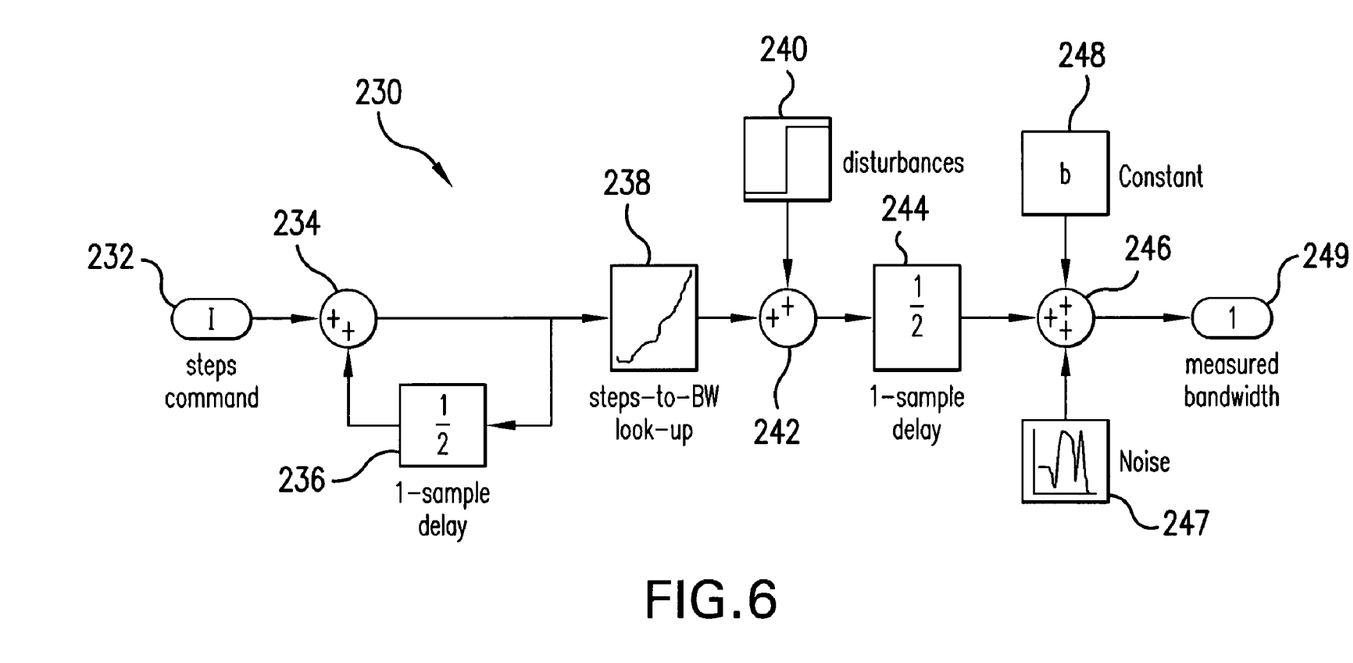
FIG. 6 illustrates schematically and in block diagram form a representative laser system "plant" to be controlled according to aspects of an embodiment of the disclosed subject matter.

FIG. 6 illustrates in block diagram form a representative laser system "plant model" wherein a bandwidth (or possibly wavelength) stepper motor steps command 232 may be input to a summer 234 and summed with an output of a one sample delay 236 to provide an input to a steps-to-BW lookup which produces an expected bandwidth value that is input to a summer 242 and summed with a representation of disturbances from disturbances block 240. Followed by a one sample delay block 244, the output of the summer 242 is summed in summer 246 with a constant from constant block 248 and noise from noise block 247 to produce a representation of what the measured bandwidth ought to be at output 249.

FIG. 7 shows an illustrative example of a bandwidth controller 250. The controller 250 may have inputs of bandwidth (or perhaps wavelength) target 252, measured bandwidth (wavelength) 254 and wavelength TIR 256, the latter two of which are inputs to a "bad" bandwidth measuring processor 257 with an output of "good" bandwidth to be summed in a summer 258 with the target bandwidth input 252 to provide an input to a noise filter 260. If the bandwidth measurement is to be filtered/ignored (e.g., because either the measurement or TIR is too large), then the output of block 257 will be a previously measured "good" bandwidth, and otherwise the measure bandwidth can be passed through block 257.

The output of the noise filter 260 provides an input to a steps command path, a mode select path and a slew steps path.

Figure 8:
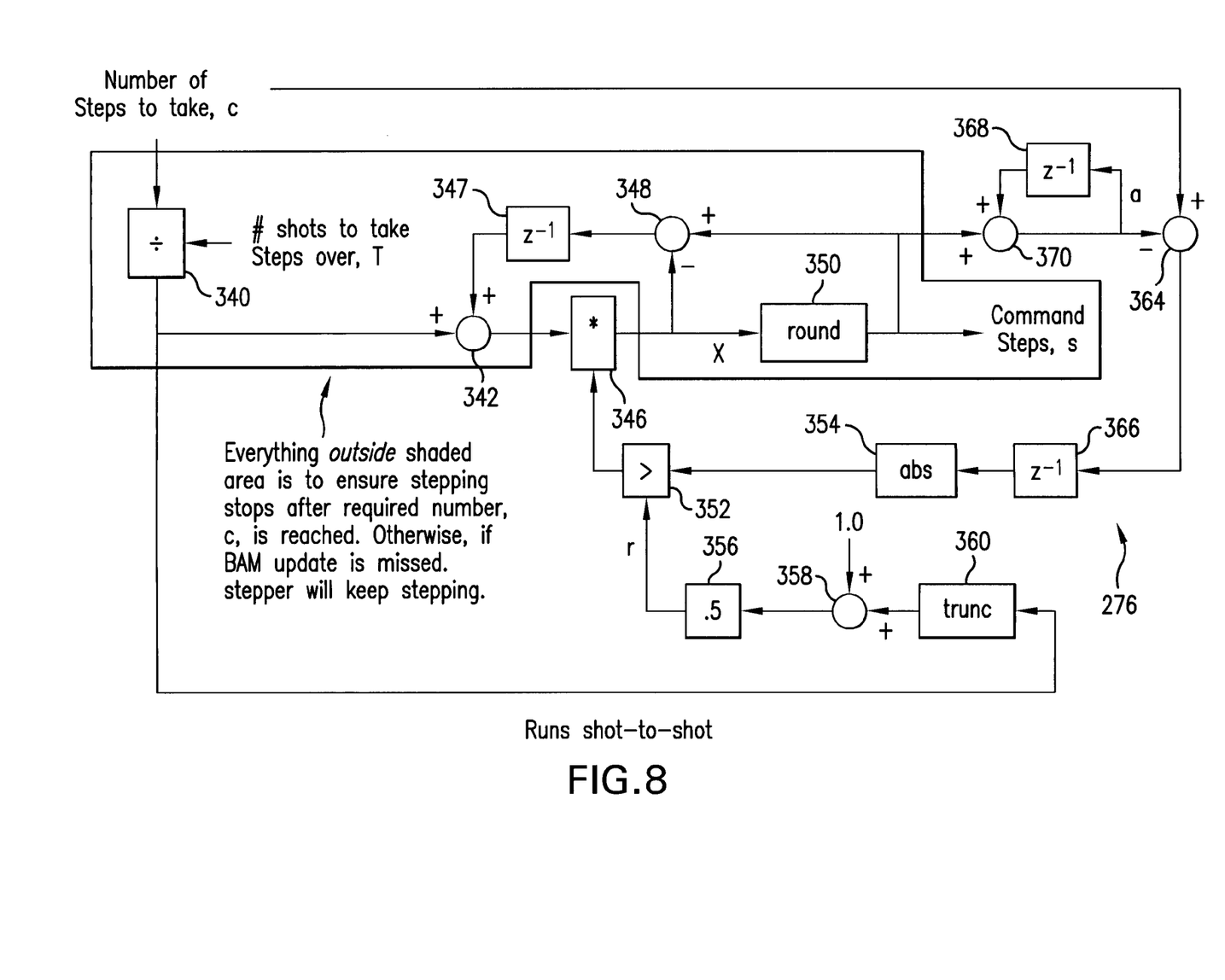
FIG. 8 illustrates schematically and in block diagram format a shot smoother according to aspects of an embodiment of the disclosed subject matter.
Figure 9:
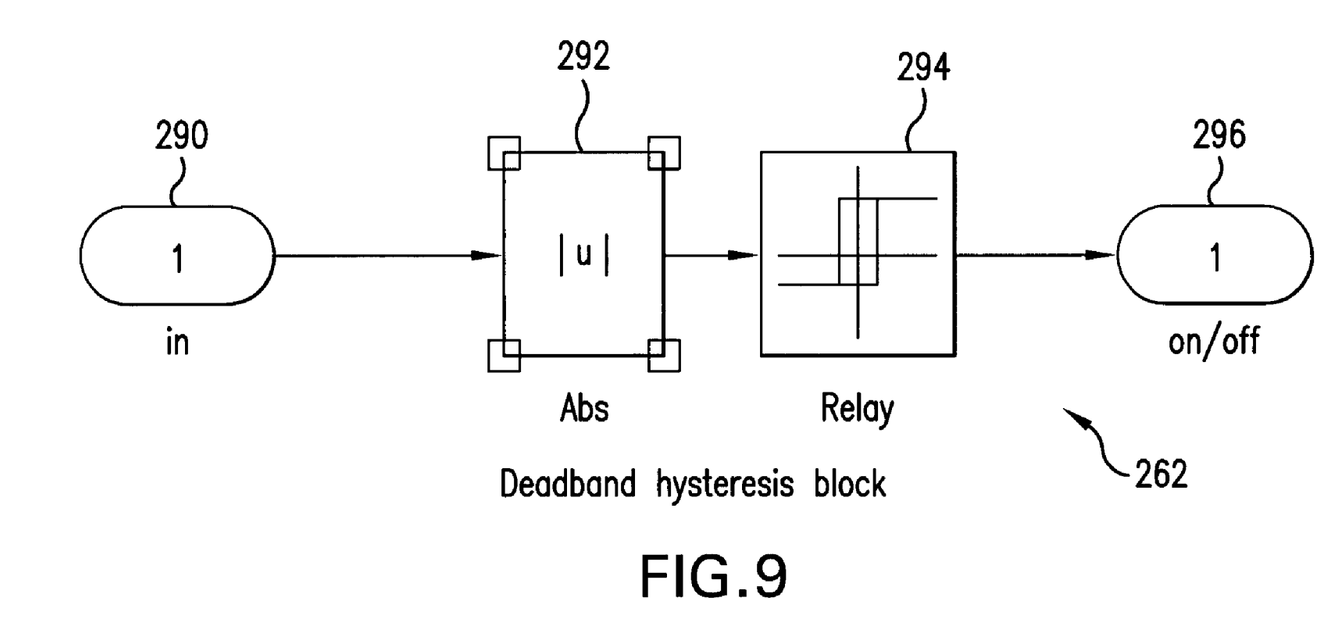
FIG. 9 illustrates schematically and in block diagram format a deadband hysteresis block according to aspects of an embodiment of the disclosed subject matter.

The steps command path may include a deadband with hysteresis "on/off" box 262, an example of which is shown in more detail in FIG. 9. If the output of the deadband with hysteresis is in the feedback actuation enabled/on mode (e.g., a 1) then the output of the multiplier 270 is the output of the noise filter 260 and if it is in the feedback actuation disabled/off mode 0 then the output of the multiplier 270 is 0. The output of the multiplier 270 is amplified by a gain factor K in control gain amplifier 274 and passes through a command saturation block 274 to a steps smoother 276 an example of which is shown in more detail in FIG. 8. The command saturation block may be utilized to limit the bandwidth step rate impact on center wavelength control. A limit may be established equal to the maximum steps per show (e.g., 0.1 times the shots per BAM/bandwidth measurement update (nominally 30), which in such a typical case would be 3 steps.

Figure 10:
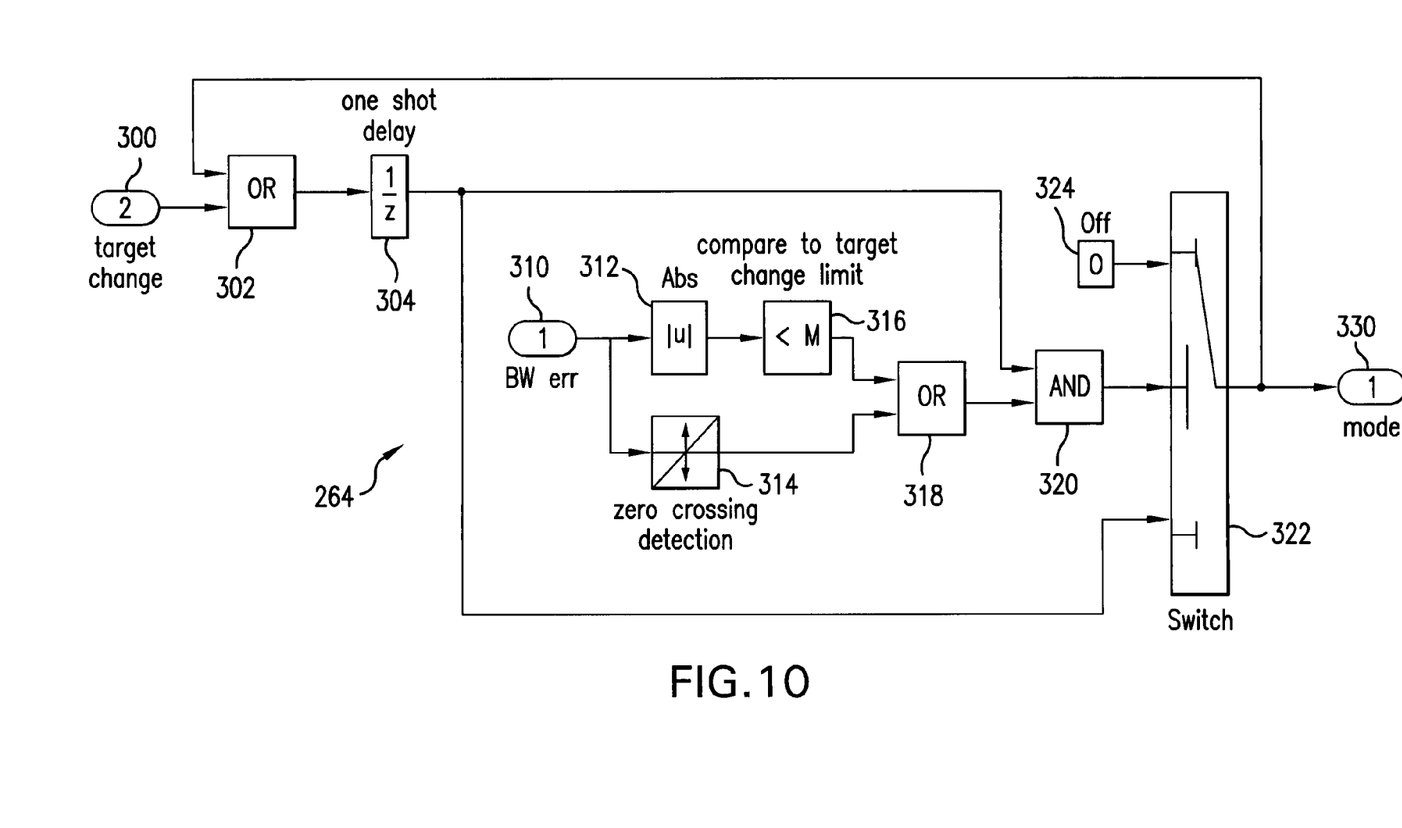
FIG. 10 illustrates schematically and in block diagram format a control mode selector according to aspects of an embodiment of the disclosed subject matter; and, FIG. 11 illustrates schematically and in block diagram format an embodiment with prisms and a center wavelength selection mirror according to aspects of an embodiment of the disclosed subject matter.

The mode selection path may include a control mode selector 264, an example of which is shown in more detail in FIG. 10. The mode selector 264 receives as an input the output of the noise filter 260 on a BW error input and the output of a target change detector 268, which has as an input to bandwidth target from input 252. The output of the target change detector 268 forms an input to the target change input of the mode selector 264. The slew steps path may include a sign box 266 receiving the output of the noise filter 260, which is amplified by a factor N in a target change slew steps amplifier 278.

The outputs of each of these paths provide inputs to respective terminals of a three pole switch 280, the output of which is a step command 284.

FIG. 9 illustrates in block diagram form a deadband hysteresis control block 262, which may have as an input 290 the output of the noise filter 260 as illustrated in FIG. 7. The input 290 may be provided to an absolute value function block 292, the output of which may be provided to a relay block 294, which may comprise, as an example, a symmetric switch with hysteresis to provide an "on/off" output 296. The symmetric switch 294 may function to produce an "on" output ("1") when the bandwidth error (or perhaps the bandwidth measured with the deadbands being in bandwidth itself as opposed to bandwidth error) is greater than the outer/high deadband value and "off" ("0") when it is less than the inner/low bandwidth value. Using bandwidth error is simply easier to implement logically, using the absolute value of the error signal compared to a high or low deadband value. The switch 294 may produce an "on" output when the bandwidth error is between the high/outer deadband value and the low/inner deadband value, if the prior output was a "1"/"on" and vice-versa when the prior output was a "0"/"off". This is the meaning of hysteresis in this context.

As illustrated in FIG. 8, a steps smoother 276 may have as an input a steps command, such as that coming from command saturation block 274 illustrated in FIG. 7. The steps smoother 276 may include a divider which divides the input steps command of steps to take, c, by the number of shots (or time) T over which to take c number of steps. The output of the divider 340 provides an input to a summer 342 and a truncation block 360.

The output of the summer 342 is provided to multiplier block 346, the output of which, X steps, is rounded off to the nearest integer in rounding block 350. The output of block 350 forms an output command of s steps, provided to the switch 280 illustrated in FIG. 7. The output of the multiplier block 346 is also subtracted in a summer 348 from the output of the rounding block 350 to provide an input to a sample delay 344, the output of which provides an input to a the summer 342. There is a need to insure that there is a limit on bandwidth control actuator steps to limit the adverse effects on wavelength control, such as on wavelength lock, which may be ≦1 BW step every 10 shots in order to maintain WL lock, which should not be an average value. The BW control loop being run once every 30 shots (which may correspond to the BAM update rate), when and if the control loop desires the maximum 3 steps during these 30 shots, which would average only 1 step/10 shots. However, if the BWCM commands all three at once other system requirements could be violated. The need exists to spread these steps out evenly during 30 shots, which is what the step smoother 276 does.

The input, c steps commanded, is also provided to a summer 364 where it is summed with the result of summing in summer 370, the output of the rounding block 350 and a single sample delay of that output delayed in block 368, with the output of the summer 364 provides an input to a single sample delay block 366. The output of block 364 provides an input to an absolute value block 354 after a one sample delay in block 360. The output of block 354 is compared in block 352 to see if it is greater than a value "r", which originates from the truncation block 360, where the result of the division in block 340 is truncated by having removed any decimal portion of that result, and is summed in summer 358 with a constant, such as 1.0, and multiplied in multiplier block 356 by a value, such as 0.5, to provide an input, r, to comparer block 352. The elements of the step smoother 256 outside of the dashed lines insure stepping stops after the required number of steps commanded, i.e., c. Otherwise, if there were not to be a BAM update at the next time for a BAM update, the stepper could simply keep on stepping the bandwidth control mechanism, even if a deadband lower/upper limit were crossed.

The controller 250 may have several parameters whose values can be selected, and for which representative values are noted in parentheses) such as noise filter coefficient, C (0.9735), controller gain, K (1), deadband inner and outer limits, $d_i$ (1.0 fm) and $d_o$ (9.5 fm) respectively, command saturation limit, L (2 steps per BAM update period), target-change-complete error limit, M (15 fm), maximum allowed wavelength TIR (300-400 fm), and maximum allowed reported bandwidth 600-1000 fm.

Given such factors as sensor noise, performance requirements, and robustness, these parameters may combine in a highly nonlinear way in determining the overall performance in closed loop. Therefore, applicants have chosen to select parameters that are more loosely coupled first. Maximum allowed TIR was selected based on experimentation during a target change slew, believed to be a worst case sustained operation. For an exemplary ArF laser system, under normal operating conditions, the maximum possible bandwidth is around 300-500 fm, therefore times 2 gives the selected limit.

In an example of an ArF laser system M was selected because a heavily filtered test signal could have significant delay between the actual and test signals, leading to early stopping of a target change slew to prevent excessive overshoot. For L, since the bandwidth and wavelength steppers can affect bandwidth, so that wavelength stepper can move to compensate for a bandwidth stepper movement (bandwidth control actuation of a control authority), e.g., through PZT desaturation in the wavelength controller. The change in wavelength due to bandwidth steps can be cancelled by wavelength steps. For K, with bandwidth stepper rate limiting, the controller has essentially infinite gain margin. Control gain is selected so commands are effectively always saturated, providing the fastest response time. With the bandwidth stepper providing ~0.005 fm per step, at two steps every 30 shots, 0.00033 fm per shot meets other system requirements. For $d_o$=9.5, along with tuning the inner deadband limit $d_i$, such as for customer bandwidth control needs, and with heavy filtering implying the filtered value is the actual instantaneous bandwidth (except under rapid changes in bandwidth such as steps), $d_o$ can provide a nominal overall deadband for the actual bandwidth. Bandwidth measurement noise being approximately white Gaussian (standard deviation ~20 fm, a total range of bandwidth less than (2*9.5=19 fm) is reasonable to limit actuation of the stepper. Inner deadband limit $d_i$=1.0 can maximize the deadband hysteresis, minimizing jitter in the commands to a bandwidth control actuation stepper or other actuator for a control authority. Also, with bandwidth measurement at about a 1 fm resolution, the inner deadband could be ineffectual if set at less than 1 fm. For C the increased stability and jitter prevention from the noise filter can also add delay, an excessive amount of which is undesirable. Command saturation can be selected from the ratio of wavelength changes from wavelength and bandwidth controller actuation steps and the desire to compensated for a bandwidth actuation step by a single wavelength step, and rounding down for integer steps, since if rounded up the wavelength stepper could lag bandwidth stepping. For a BAM integration period of 30 shots, the wavelength controller may allow 1 wavelength step every 30 shots. Therefore L=2 which is about 0.00033 fm per shot, meeting system requirements. If the size of the steps were to increase (or their effect on bandwidth), this could reduce gain margin.

The step response of the noise filter can be:

$$y_k = u(1 - c^k) + y_0 + v_k$$

where u is the size of the step input, $y_0$ is the initial output, C is the coefficient, v is filtered noise, and k=30*(shot number). With the controller 250 inside the deadband when a step disturbance occurs, control action may not start until filtered error increases above $d_o$, with time required being an initial delay due to the filter. Solving for k when y crosses the deadband:

$$u(1 - c^k) + y_0 + v_k > d_o \Rightarrow$$

$$c^k < \frac{u + y_0 - d_o + v_k}{u} \Rightarrow$$

$$k > \frac{\ln(u + y_0 - d_o + v_k) - \ln(u)}{\ln(c)}$$

where it is known that C<1. Assuming the deadband is, on average, 1 sigma before the actual filtered bandwidth reaches the deadband (due to noise and ignoring noise "spikes"), with $d_o > y_0$, and avoiding $u+y_0 < d_o$, implying $u+y_0-d_o > 0$, k can be maximized when u is large and $u+y_0-d_o$ is small. Even so there could be a combination of disturbance and initial conditions for which it takes nearly infinite time for the filtered error to pass above $d_o$, regardless of C. With bandwidth measured with 1 fm resolution (minimum of $u+y_0-d_o=1$ is reasonable) and with $d_o$=9.5 (largest value of u that will minimize $u+y_0-d_0$ is $u=2*d_o+1=20$), then an initial condition may be at the "bottom" of the deadband, and a step disturbance may be enough to leave the "top" of the deadband. First order filter response (no overshoot) can take the longest to exit the deadband. With 30 shots per sample, and the minimum shot accumulation rate of 200 shots/sec, the maximum time to leave the deadband could be determined by:

$$t_{\max} = \frac{30 \dfrac{\left(1 + \sigma_s \sqrt{\dfrac{1-c}{1+c}}\right) - \ln(20)}{\ln(c)}}{200}$$

where $\sigma_s$ is the sensor noise standard deviation, by way of example, equal to 20 fm. This may define an absolute worst case, and a Monte Carlo study showed typical delays are less than 0.5 seconds, making a delay of 10 seconds a reasonable selection, such that a filter coefficient of C=0.9735 is reasonable.

A combination of a stepper motor and a BWCM can act as an accumulator (integrator) with rate limit (4000 microsteps/second), which may also be very noise free. BW is a nonlinear function of absolute stepper position, and there may also be negligible coupling from WL to BW, which can allow for closing the BW control loop separately and independently from other loops. However, coupling from BW to WL, along with a requirement to induce ≦5 fm WL error can require special consideration. Although the plant being controlled can act as a natural integrator, with good noise rejection properties, additional filtering may be necessary to help prevent jitter in stepper commanding.

The system may seek to move the bandwidth control mechanism stepper to a baseline position, such as a baseline magnification or a baseline aperture opening or the like. This may be done by using limit switches, such as in the LNM, commanding a very large number of steps, such as, to max magnification and awaiting an interrupt signal from a respective limit switch, which causes the BWCM to stop commanding stepper actuation due to the signal from the limit switch. The same can be applied in regard to other bandwidth control actuators, such as an adjustable aperture. The limit switch location should be set to known bandwidth setting, such as a known magnification or a known aperture size and location. When this functionality is being exercised, one may also measure and update a BW-vs-steps curve.

Applicants have simulated such a bandwidth control system and determined from such simulation that system response may be dominated by the algorithm BW stepper rate limit, for example, ~0.0005 fm/shot. Filtering can effectively improve noise response to tighten the deadband. Controller gain may be set high enough so the stepper command is always either saturated or "off". The system can achieve error=(inner deadband)+(~3σ filtered noise), which may then "creep" lower as noise spikes trigger occasional steps (assuming no disturbances). The creep can be minimized by increasing the size of the hysteresis. Deadband plus the noise filter can effectively eliminate jitter. The system can be highly robust, with a gain margin essentially infinite. The BW stepper rate limit along with the deadband can prevent noise from injecting destabilizing motion into the system.

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the present inventions) noted above, others could be implemented.

We claim:

1. A method of controlling bandwidth in a laser system comprising:
    a gas discharge seed laser having a cavity and producing a seed laser output;
    a gas discharge amplifier laser amplifying the seed laser output and producing a laser system output;
    a bandwidth metrology unit which measures the bandwidth of the laser system output and provides a bandwidth measurement; and
    a bandwidth error signal generator which receives the bandwidth measurement and a bandwidth set point and provides a bandwidth error signal;
    a variable magnification line narrowing unit within the cavity of the seed laser comprising a grating and a variable beam magnification optical system;
    a differential timing controller selecting the timing of the firing of a discharge between a respective pair of electrodes in the seed laser and a respective pair of electrodes in the amplifier laser;
    the method comprising:
    controlling bandwidth with a bandwidth controller having at least two modes of magnification control including an independent mode that adjusts the magnification of the beam in the line narrowing unit to a selected value independent of the bandwidth error signal and a feedback mode that adjusts the magnification of the beam in the line narrowing unit in response to the bandwidth error signal, and
    wherein in each mode the differential timing controller selects the timing in response to the bandwidth error signal or without regard to the bandwidth error signal.

2. The method of claim 1 wherein:
    adjusting the magnification of the beam in the line narrowing unit in response to the bandwidth error signal includes continuing to adjust the magnification of the beam in the line narrowing unit until the bandwidth crosses the inner bandwidth deadband value along a first direction and resuming adjustment of the magnification of the beam in the line narrowing unit only after the bandwidth crosses the output bandwidth deadband value along a second direction that is opposite to the first direction.

3. The method of claim 1 further comprising:
    utilizing two modes of bandwidth error reduction:
    a first normal bandwidth error reduction mode wherein the bandwidth controller executes bandwidth error reduction commands so as not to significantly impact another laser system operating parameter other than bandwidth; and
    a second bandwidth target change error reduction mode wherein the bandwidth controller executes bandwidth error reduction commands so as to change to the new bandwidth target without regard to impact on the other laser operating parameter; and
    the bandwidth controller switching to the second error reduction mode upon a change in bandwidth target and to the first upon reaching the new bandwidth target.

4. The method of claim 1 further comprising:
    limiting bandwidth actuator dithering by allowing a minimum number of steps in a first direction before allowing any steps a second opposite direction.

5. The method of claim 1 further comprising:
    when bandwidth target is changed driving the bandwidth controller to the new bandwidth target based upon an error between the measured bandwidth and the new target bandwidth within a selected amount of time and signaling that the laser system can not be relied upon to be in specification during the selected amount of time.

6. The method of claim 1 further comprising:
    utilizing a function generator to command a bandwidth selection actuator stepper.

7. The method of claim 6 wherein:
    the function generator commands the bandwidth selection actuator based on arbitrary functions of shot count.

8. The method of claim 1 wherein:
    the bandwidth controller comprises a bandwidth selection actuator step command smoother.

9. A laser system comprising:
    a gas discharge seed laser having a cavity and producing a seed laser output;
    a gas discharge amplifier laser amplifying the seed laser output and producing a laser system output;
    a bandwidth metrology unit which measures the bandwidth of the laser system output and provides a bandwidth measurement; and
    a bandwidth error signal generator which receives the bandwidth measurement and a bandwidth set point and provides a bandwidth error signal;
    a variable magnification line narrowing unit within the cavity of the seed laser comprising a grating and a variable beam magnification optical system;
    a differential timing controller selecting the timing of the firing of a discharge between a respective pair of electrodes in the seed laser and a respective pair of electrodes in the amplifier laser;
    a bandwidth controller having at least two modes of magnification control, an independent mode in which the bandwidth controller controls the variable magnification line narrowing unit to drive the magnification to a selected value, independent of the bandwidth error signal and a feedback mode in which the bandwidth controller controls the variable magnification line narrowing unit in response to the bandwidth error signal to select the bandwidth of the laser system output, and
    wherein the differential timing controller selects the timing in response to the bandwidth error signal or without regard to the bandwidth error signal.

10. The method of claim 1 wherein the bandwidth controller is configured to operate in a no-control mode in which the magnification of the beam is not controlled by the line narrowing unit.

11. The method of claim 1 wherein adjusting the magnification of the beam in the line narrowing unit in response to the bandwidth error signal includes:
    turning on control only when the bandwidth leaves an outer bandwidth deadband value; and
    turning off control when the bandwidth returns to within an inner bandwidth deadband value.

12. The method of claim 8 wherein the bandwidth selection actuator step command smoother is configured to limit a rate at which the laser beam magnification is adjusted.

13. The system of claim 9 wherein the bandwidth controller comprises a bandwidth selection actuator step command smoother.

14. The system of claim 9 wherein the bandwidth controller is configured to operate in a no-control mode in which the magnification of the beam is not controlled by the line narrowing unit.

15. The system of claim 9 wherein the variable beam magnification optical system comprises a set of four prisms.

16. The system of claim 15 wherein at least one of the prisms is rotatable.

17. The system of claim 15 wherein at least one of the prisms is stationary.

18. A method of controlling bandwidth in a laser system having a seed laser and an amplifier laser amplifying an output of the seed laser, the method comprising:
controlling a center wavelength of the laser system output based on a received measurement of the laser system output center wavelength; and
controlling the bandwidth by:
adjusting a magnification of a laser beam in a variable magnification line narrowing unit within a cavity of the seed laser, wherein adjusting the laser beam magnification includes limiting a rate at which the laser beam magnification is adjusted to a value that limits impact on the center wavelength control; and
adjusting a timing of a firing of a discharge between electrodes in the seed laser and electrodes in the amplifier laser.

19. The method of claim 18 further comprising:
receiving a measurement of a bandwidth of an output of the laser system and determining a bandwidth error signal based on the bandwidth measurement and a bandwidth set point.

20. The method of claim 19 wherein adjusting the laser beam magnification in the variable magnification line narrowing unit includes adjusting in response to the determined bandwidth error signal.

21. The method of claim 18 wherein limiting the magnification rate adjustment includes spacing in time or in shot count the number of magnification adjustment steps in a single feedback control loop.

22. The method of claim 18 wherein adjusting the timing of the discharge firing includes adjusting the timing in response to a bandwidth error signal.

23. The method of claim 18 wherein adjusting the timing of the discharge firing includes adjusting the timing without regard to a bandwidth error signal.

24. The method of claim 17 wherein adjusting the magnification of the laser beam includes:
turning on bandwidth control only when the bandwidth leaves an outer bandwidth deadband value; and
turning off bandwidth control when the bandwidth returns to within an inner bandwidth deadband value.

25. A laser system comprising:
a seed laser having a cavity and producing a seed laser output;
an amplifier laser amplifying the seed laser output and producing a laser system output;
a variable magnification line narrowing unit within the cavity of the seed laser comprising a grating and a variable beam magnification optical system that receives a seed laser beam;
a differential timing controller configured to select the timing of the firing of a discharge between a respective pair of electrodes in the seed laser and a respective pair of electrodes in the amplifier laser; and
a bandwidth controller configured to adjust a magnification of the seed laser beam in the variable magnification line narrowing unit to select the bandwidth of the laser system output, the bandwidth controller including a bandwidth selection actuator step command smoother.

26. The system of claim 25 further comprising:
a bandwidth metrology unit that measures the bandwidth of the laser system output and provides a bandwidth measurement; and
a bandwidth error signal generator that receives the bandwidth measurement and a bandwidth set point and provides a bandwidth error signal.

27. The system of claim 26 wherein the bandwidth controller is configured to adjust the magnification of the seed laser beam in response to the bandwidth error signal.

28. The system of claim 25 wherein the differential timing controller selects the timing in response to a bandwidth error signal.

29. The system of claim 25 wherein the differential timing controller selects the timing without regard to a bandwidth error signal.

30. The system of claim 25 further comprising a center wavelength controller that is configured to control a center wavelength of the laser system output based on a received measurement of the laser system output center wavelength.

31. The system of claim 25 wherein the step command smoother is configured to limit a rate at which the seed laser beam magnification is adjusted to a value that limits impact on control of a center wavelength.

32. The system of claim 31 wherein the bandwidth controller also includes a command saturation block that determines a number of steps needed to adjust the magnification of the seed laser beam and the step command smoother receives the determined number of steps from the command saturation block.

* * * * *